(12) United States Patent
Kim

(10) Patent No.: US 11,229,133 B2
(45) Date of Patent: Jan. 18, 2022

(54) ELECTRONIC DEVICE INCLUDING MAGNET

(71) Applicant: Samsung Electronics Co., Ltd., Gyeonggi-do (KR)

(72) Inventor: Chungha Kim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/450,130

(22) Filed: Jun. 24, 2019

(65) Prior Publication Data

US 2019/0394894 A1 Dec. 26, 2019

(30) Foreign Application Priority Data

Jun. 22, 2018 (KR) ........................ 10-2018-0071875

(51) Int. Cl.
*H01F 7/02* (2006.01)
*H05K 5/02* (2006.01)
*H05K 5/00* (2006.01)

(52) U.S. Cl.
CPC ......... *H05K 5/0226* (2013.01); *H01F 7/0263* (2013.01); *H01F 7/0268* (2013.01); *H05K 5/0086* (2013.01)

(58) Field of Classification Search
None
See application file for complete search history.

(56) References Cited

U.S. PATENT DOCUMENTS

| 10,480,225 | B1* | 11/2019 | Hsu ........................... E05D 3/12 |
| 10,501,973 | B2* | 12/2019 | Maatta .................. G06F 1/1618 |
| 10,732,677 | B2* | 8/2020 | Gopalan ................. H04M 1/02 |
| 10,775,852 | B2* | 9/2020 | Kim ..................... H04M 1/0268 |
| 2010/0238620 | A1 | 9/2010 | Fish |
| 2013/0162668 | A1 | 6/2013 | Lauder et al. |
| 2016/0226182 | A1 | 8/2016 | Szeto |

(Continued)

FOREIGN PATENT DOCUMENTS

| KR | 1020160083948 | 7/2016 |
| KR | 1020170035319 | 3/2017 |

(Continued)

OTHER PUBLICATIONS

International Search Report dated Oct. 1, 2019 issued in counterpart application No. PCT/KR2019/007517, 14 pages.

*Primary Examiner* — Anthony Q Edwards
*Assistant Examiner* — Rashen E Morrison
(74) *Attorney, Agent, or Firm* — The Farrell Law Firm, P.C.

(57) ABSTRACT

An electronic device includes a first housing including a first side surface, a second housing including a second side surface that may face at least a portion of the first side surface, a first magnet group disposed adjacent to the first side surface in the first housing and including a first designated pattern along a lengthwise direction, and a second magnet group disposed adjacent to the second side surface in the second housing and including a second designated pattern along a lengthwise direction, wherein the first designated pattern of the first magnet group and the second designated pattern of the second magnet group are alternately magnetized with an N pole or an S pole, and wherein the first housing and the second housing are coupled together to be rotatable by the first magnet group and the second magnet group.

20 Claims, 13 Drawing Sheets

(56) References Cited

U.S. PATENT DOCUMENTS

| | | | |
|---|---|---|---|
| 2017/0083049 A1 | 3/2017 | Kim et al. | |
| 2017/0145725 A1* | 5/2017 | Siddiqui | E05D 5/10 |
| 2018/0166842 A1* | 6/2018 | Siddiqui | G06F 1/1681 |
| 2018/0209473 A1* | 7/2018 | Park | E05D 3/06 |
| 2018/0356864 A1 | 12/2018 | Lee et al. | |
| 2019/0004764 A1 | 1/2019 | Son et al. | |

FOREIGN PATENT DOCUMENTS

| | | |
|---|---|---|
| KR | 10-2018-0135327 | 12/2018 |
| KR | 10-2019-0001822 | 1/2019 |
| WO | WO 2017/111817 | 6/2017 |

\* cited by examiner

ELECTRONIC DEVICE INCLUDING MAGNET

CROSS-REFERENCE TO RELATED APPLICATION(S)

This application is based on and claims priority under 35 U.S.C. § 119 to Korean Patent Application No. 10-2018-0071875, filed on Jun. 22, 2018, in the Korean Intellectual Property Office, the disclosure of which is incorporated by reference herein in its entirety.

BACKGROUND

1. Field

The present disclosure relates generally to electronic devices having magnets (or magnetic members) with a designated pattern inside the housing.

2. Description of Related Art

The term "electronic device" may mean a device performing a particular function according to its equipped program, such as a home appliance, an electronic scheduler, a portable multimedia player, a mobile communication terminal, a tablet personal computer (PC), a video/sound device, a desktop PC or laptop computer, or a navigation device for an automobile. For example, electronic devices may output stored information as sounds or images. As electronic devices become highly integrated for high-speeds, high-volume wireless communication is becoming commonplace, and such electronic devices are being equipped with many different functions.

Considering portable terminals as an example, as mobile communication services are extended to multimedia service sectors, electronic devices may require a larger display to be able to provide different multimedia services, in addition to voice call or text messaging services.

However, an increased display size results in an increase in the overall size of the electronic device, which goes against the recent trend of electronic devices becoming more compact and smaller.

To achieve a larger display area, different types of displays are being developed, such as edge displays, curved displays, or flexible displays, which are capable of display on side surfaces as well as front surface.

Another way to provide a larger display screen is to couple two electronic devices each having its own display together via a hinge. A larger-screen display may be achieved by unfolding the two electronic devices hinged together and displaying a single seamless image on the two displays. The two electronic devices may be folded on each other, thereby leading to improved portability for the electronic devices.

This, however, render it difficult to achieve an aesthetic look for the electronic device due to exposure of the hinge through the housing. Further, typical hinge structures may not implement various operations, e.g., changing the angle between the two electronic devices. Also the physical force (e.g., hinge torque) of the hinge may not be strong enough to allow the hinge to stably operate to implement various operations for the two electronic devices.

Thus, it may be advantageous to provide an electronic device with a plurality of displays which may be folded or unfolded on each other even without using a hinge exposed to the outside of the electronic device, and which may be operable at various angles between displays.

SUMMARY

The present disclosure has been made to address the above-mentioned problems and disadvantages, and to provide at least the advantages described below.

In accordance with an aspect of the present disclosure, an electronic device includes a first housing including a first side surface, a second housing including a second side surface that may face at least a portion of the first side surface, a first magnet group disposed adjacent to the first side surface in the first housing and including a first designated pattern along a lengthwise direction, and a second magnet group disposed adjacent to the second side surface in the second housing and including a second designated pattern along a lengthwise direction, wherein the first designated pattern of the first magnet group and the second designated pattern of the second magnet group are alternately magnetized with an N pole or an S pole, and wherein the first housing and the second housing are coupled together to be rotatable by the first magnet group and the second magnet group.

In accordance with another aspect of the present disclosure, an electronic device includes a first housing including a first side surface, a second housing including a second side surface that may face at least a portion of the first side surface, a first magnet group disposed adjacent to the first side surface in the first housing, a second magnet group disposed adjacent to the second side surface in the second housing, a first connecting member disposed in the first housing and connected with at least one end of the first magnet group to fix the first magnet group to the first housing, a second connecting member disposed in the second housing and connected with at least one end of the second magnet group to fix the second magnet group to the second housing, a first stopper including an elastic material and disposed in the first housing to limit rotation of the first connecting member, and a second stopper including an elastic material and disposed in the second housing to limit rotation of the second connecting member.

In accordance with another aspect of the present disclosure, an electronic device includes a first housing including a first side surface, a second housing including a second side surface that may face at least a portion of the first side surface, a first magnet group disposed adjacent to the first side surface in the first housing, a second magnet group disposed adjacent to the second side surface in the second housing, a first connecting member disposed in the first housing and connected with at least one end of the first magnet group to fix the first magnet group to the first housing, a second connecting member disposed in the second housing and connected with at least one end of the second magnet group to fix the second magnet group to the second housing, a first stopper including an elastic material and disposed in the first housing to limit rotation of the first connecting member, and a second stopper including an elastic material and disposed in the second housing to limit rotation of the second connecting member.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, embodiments of the disclosure are described with reference to the accompanying drawings.

Figure 1:
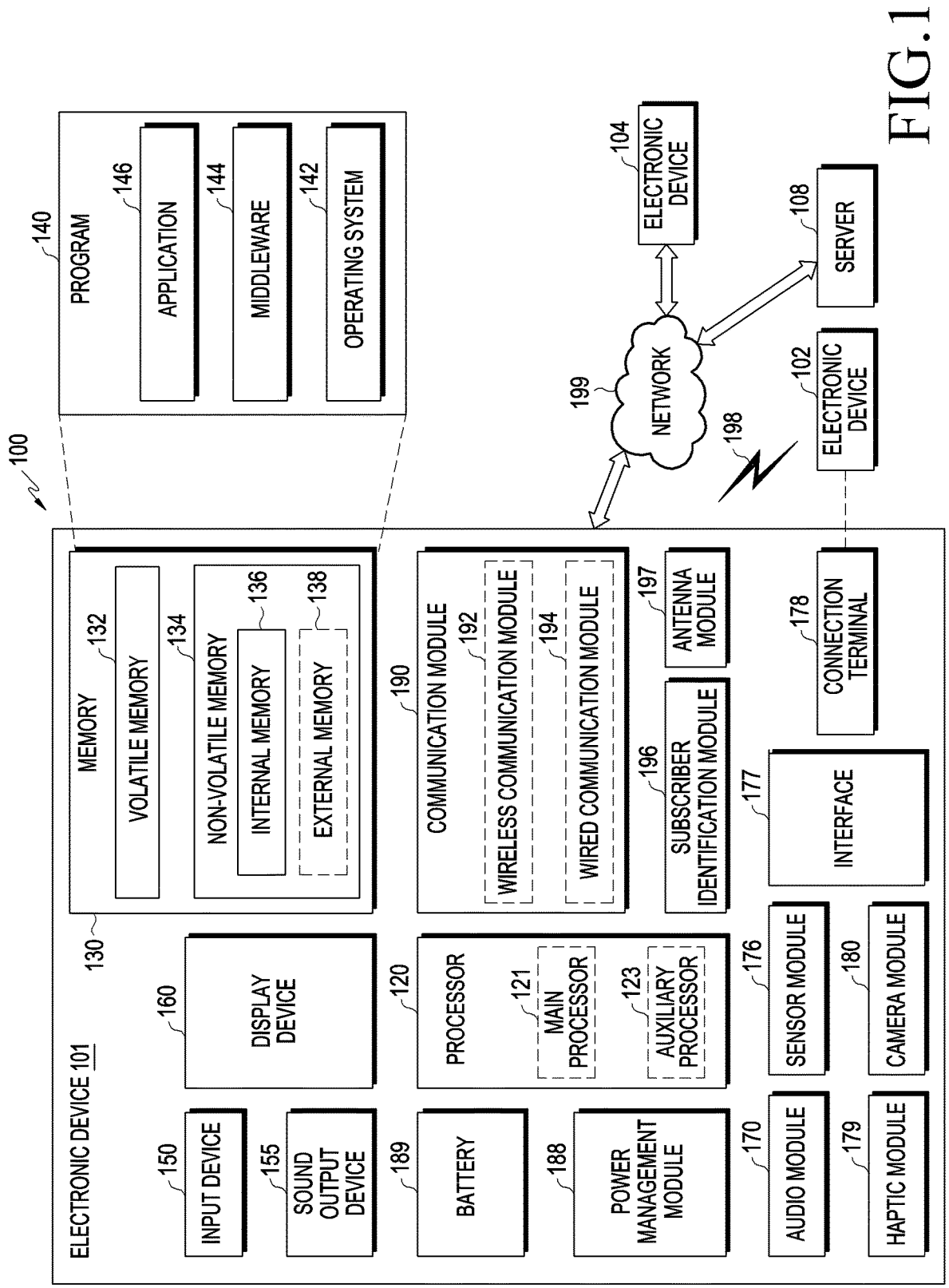
FIG. 1 is a block diagram illustrating an electronic device in a network environment, according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, e.g., software (e.g., a program 140) to control at least one other component (e.g., a hardware or software component) of the electronic device 101 connected with the processor 120 and may process or compute various data. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, e.g., a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via the user's tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performance to the electronic device 101. The electronic device 101 may provide the outcome, with or without further processing of the outcome, as at least part of a reply to the request. To that end, a cloud computing, distributed computing, or client-server computing technique may be used, for example.

The electronic device according to various embodiments may be one of various types of electronic devices. The electronic devices may include, e.g., a portable communication device (e.g., a smartphone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
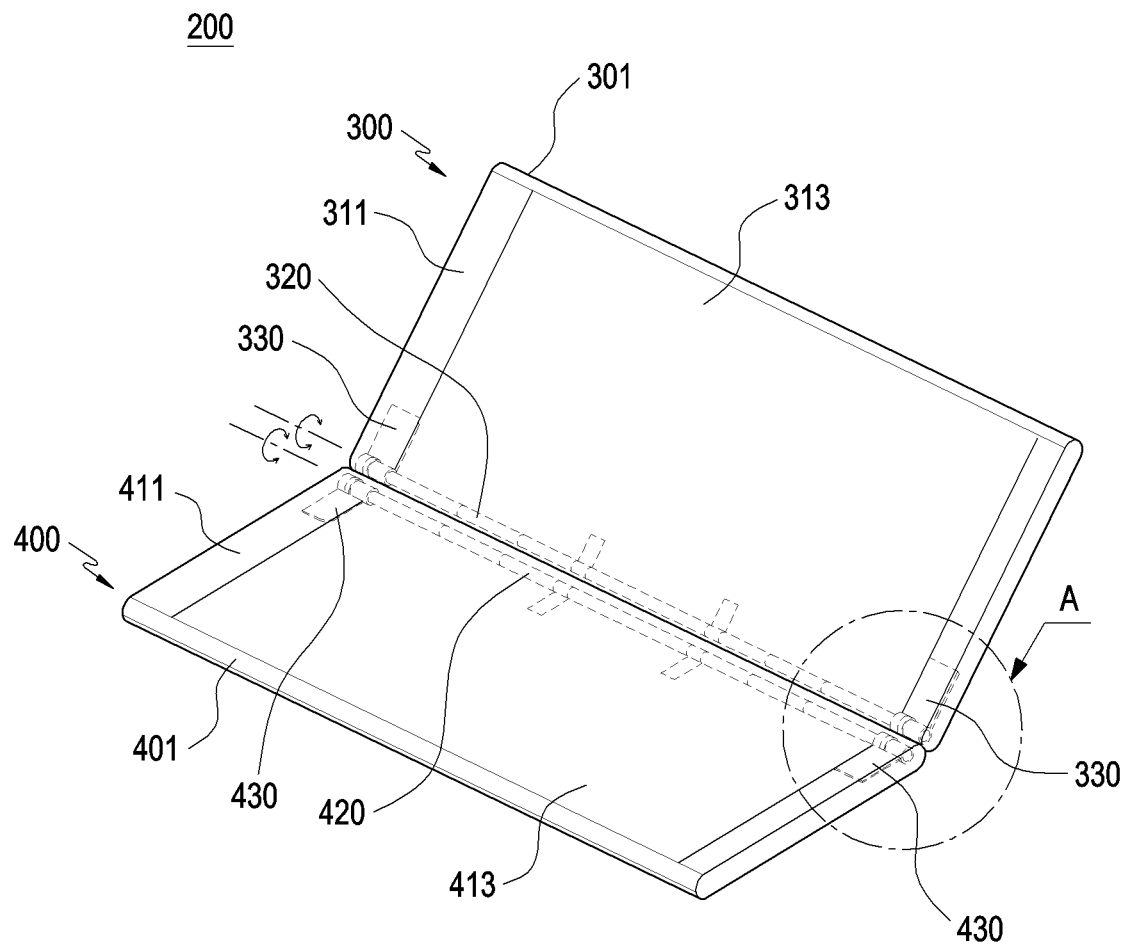
FIG. 2A is a perspective view illustrating an electronic device, according to an embodiment.

FIG. 2A is a perspective view illustrating an electronic device 200, according to an embodiment.

Figure 2B:
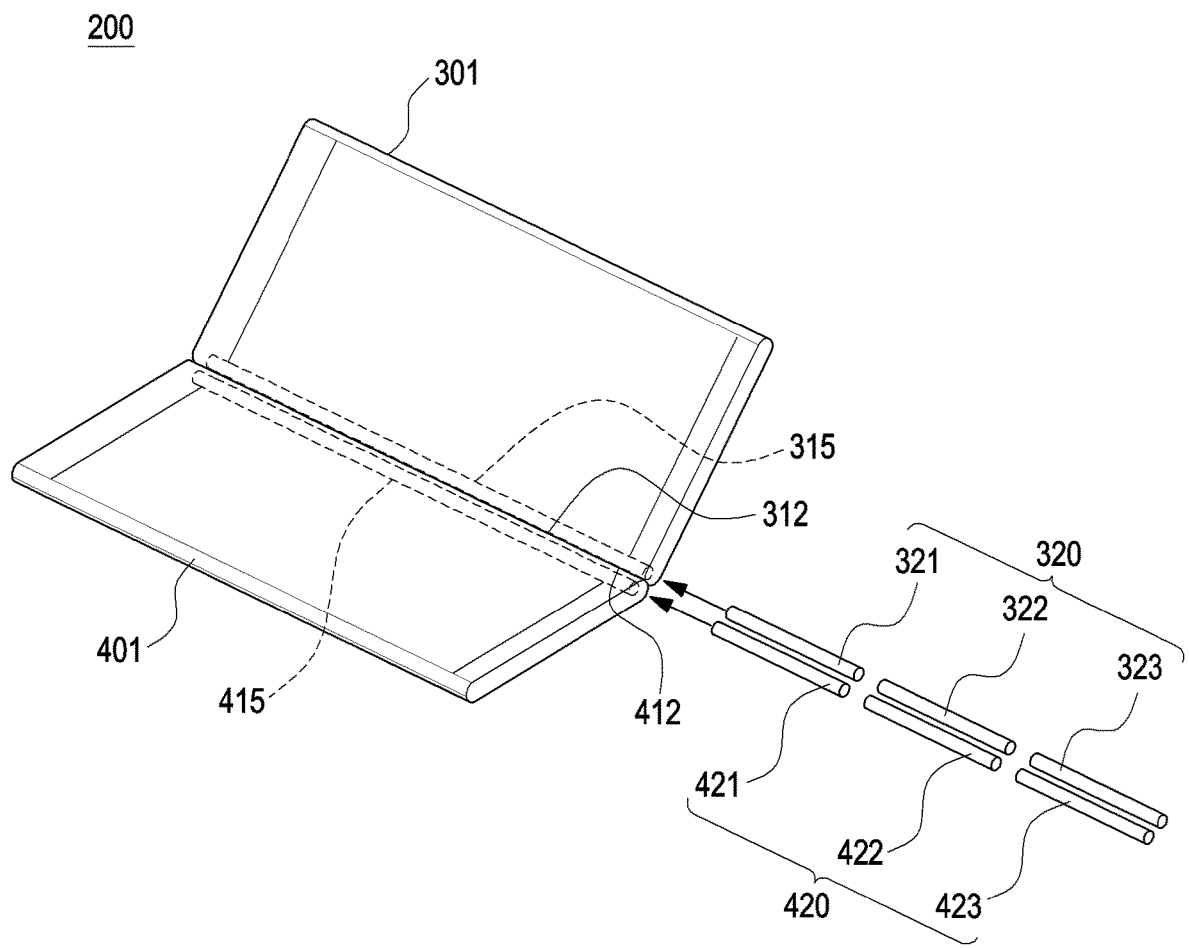
FIG. 2B is a view illustrating an electronic device with a first magnet group and a second magnet group removed from a first receiving part and a second receiving part, respectively, according to an embodiment.

FIG. 2B is a view illustrating an electronic device 200 with a first magnet (or magnetic member) group 320 and a second magnet group 420 removed from a first receiving part 315 and a second receiving part 415, respectively, according to an embodiment.

Referring to FIGS. 2A and 2B, an electronic device 200 may include a first electronic device 300 and a second electronic device 400. The first electronic device 300 may be the same or different in type from the second electronic device 400. The first electronic device 300 may transmit or receive commands or data to/from the second electronic device 400 via a first network (e.g., a short-range wireless communication network) or a second network (e.g., a remote wireless communication network).

The first electronic device 300 may include a first housing 301, a first magnet group 320, and a first hinge structure 330. The first housing 301 may include a front surface 311 through which a first display device 313 is at least partially exposed to the outside, a rear surface of the first electronic device 300 which is formed in a direction opposite to the front surface 311, and a first side surface 312 surrounding at least part of a space between the front surface 311 and the rear surface of the first electronic device 300.

The first side surface 312 may be a surface facing in any one direction among different side surfaces of the first electronic device 300 which surround the space between the front surface 311 of the first electronic device 300 and the rear surface of the first electronic device 300. The first electronic device 300 may include a first receiving part 315 formed through the inside the first housing 301 along a lengthwise direction of the first side surface 312 and formed adjacent to the first side surface 312.

The second electronic device 400 may include a second housing 401, a second magnet group 420, and a second hinge structure 430. The second housing 401 may include a front surface 411 through which a second display device 413 is at least partially exposed to the outside, a rear surface of the second electronic device 400 which is formed in a direction opposite to the front surface 411, and a second side surface 412 surrounding at least part of a space between the front surface 411 and the rear surface of the second electronic device 400.

The second side surface 412 may be a surface facing in any one direction among different side surfaces of the second electronic device 400 which surround the space between the front surface 411 of the second electronic device 400 and the rear surface of the second electronic device 400. The second electronic device 400 may include a second receiving part 415 formed through the inside the second housing 401 along a lengthwise direction of the second side surface 412 and formed adjacent to the second side surface 412.

The first display device 313 and the second display device 413 provided in the first electronic device 300 and the second electronic device 400 may include, e.g., liquid crystal displays (LCDs), light emitting diode (LED) displays, organic light emitting diode (OLED) displays, micro-electro-mechanical systems (MEMS) displays, or electronic paper displays. The first display device 313 and the second display device 413 may display various contents (e.g., texts, images, videos, icons, or symbols) to the user. The first display device 313 and the second display device 413 may include a touchscreen and may receive a touch, a gesture, or a proximity or hovering input using an electronic pen or a body portion of the user.

The first electronic device 300 and the second display device 413 may have a first side surface 312 and a second side surface 412 at least partially facing each other. FIGS. 2A and 2B illustrate an example in which the first side surface 312 and the second side surface 412 are arranged adjacent and in parallel with each other along their lengthwise direction. When the first housing 301 and the second housing 401 rotate about each other (e.g., on-magnet axis rotation), the front surface (or rear surface) of the first electronic device 300 may be rendered away from or close to the rear surface (or front surface) of the second electronic device 400, with the first side surface 312 and the second side surface 412 parallelly contacting each other. When the first housing 301 and the second housing 401 are rotated about each other (e.g., on-contact point axis rotation), a portion of the first side surface 312 (e.g., an edge portion of the first side surface 312) and a portion of the second side surface 412 (e.g., an edge portion of the second side surface 412) may be moved away from each other, with another portion of the first side surface 312 (e.g., a center portion of the first side surface 312) abutting another portion of the second side surface 412 (e.g., a center portion of the second side surface 412). As described below in connection with FIG. 11, when the first housing 301 and the second housing 401 are rotated about each other on a contact point axis, the display device 313 of the first electronic device 300 and the display device 413 of the second electronic device 400 may face in opposite directions in a certain position.

The first electronic device 300 may include a first magnet group 320 including at least one magnet (or magnetic member), and the second electronic device 400 may include a second magnet group 420 including at least one magnet. Upon being received in the first receiving part 315, the first magnet group 320 may be placed adjacent to the first side surface 312 of the first housing 301 and, upon being received in the second receiving part 415, the second magnet group 420 may be placed adjacent to the second side surface 412 of the second housing 401. As the first magnet group 320 and the second magnet group 420 are placed adjacent to each other in operating the electronic device 200, the first housing 301 and the second housing 401 may be coupled together to be rotatable about each other by the first magnet group 320 and the second magnet group 420.

Figure 3:
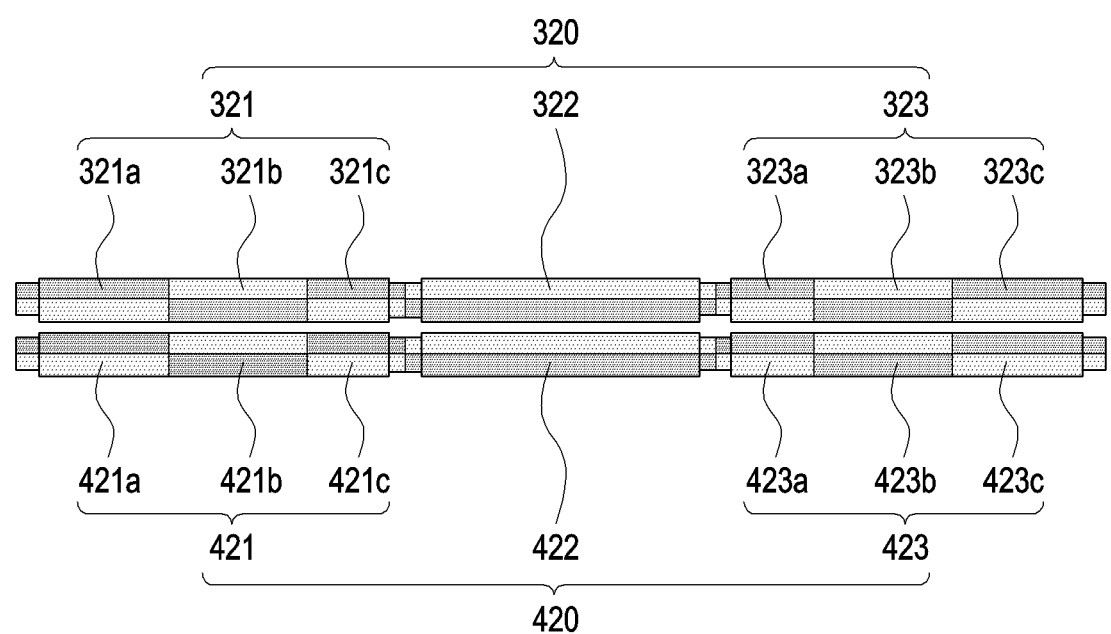
FIG. 3 is a view illustrating a first magnet group and a second magnet group, according to an embodiment.

FIG. 3 is a view illustrating a first magnet group 320 and a second magnet group 420, according to an embodiment.

Referring to FIG. 3, the first magnet group 320 and the second magnet group 420 each may be patterned with a designated pattern shape. A first designated pattern of the first magnet group 320 and a second designated pattern of the second magnet group 420 may correspond to each other. For example, the first designated pattern of the first magnet group 320 and the second designated pattern of the second magnet group 420 may be shaped to be alternately magnetized with N poles or S poles with respect to each other.

The first magnet group 320 may include at least one odd number of sub magnet groups, and the second magnet group 420 may include at least one odd number of sub magnet groups.

As shown in FIG. 3, the first magnet group 320 may include three sub magnet groups 321, 322, and 323, and the second magnet group 420 may include three sub magnet groups 421, 422, and 423, corresponding to the first magnet group 320. In this case, the first magnet group 320 may include a first sub magnet group 321, a second sub magnet group 322, and a third sub magnet group 323. The second magnet group 420 may include a fourth sub magnet group 421 disposed to form an attracting force corresponding to the first sub magnet group 321, a fifth sub magnet group 422 disposed to form an attracting force corresponding to the second sub magnet group 322, and a sixth sub magnet group 423 disposed to form an attracting force corresponding to the third sub magnet group 323.

At least any one of the sub magnet groups 321, 322, and 323 included in the first magnet group 320 and at least any one of the sub magnet groups 421, 422, and 423 included in the second magnet group 420 may include a plurality of unit magnetized parts. The unit magnetized part may be a magnet in which an N pole and an S pole with respect to the center of the magnet are aligned along a diameter direction (or width direction) on the circumference. As shown in FIG. 3, the first sub magnet group 321 may include a plurality of unit magnetized parts 321a, 321b, and 321c, the third sub magnet group 323 may include a plurality of unit magnetized parts 323a, 323b, and 323c, the fourth sub magnet group 421 may include a plurality of unit magnetized parts 421a, 421b, and 421c, and the sixth sub magnet group 423 may include a plurality of unit magnetized parts 423a, 423b, and 423c. The second sub magnet group 322 and the fifth sub magnet group 422 each may be formed not of a plurality of unit magnetized parts but of a single unit magnetized part.

It should be noted that the first magnet group 320 and the second magnet group 420 each may be formed of five, seven, or more sub magnet groups. The unit magnetized parts in the sub magnet groups 321, 322, 323, 421, 422, and 423 may be provided in a different number and area from those shown in FIG. 3. When the first magnet group 320 and the second magnet group 420 each include an odd number of sub magnet groups, rotation of the first housing 301 and the second housing 401 (e.g., on-contact point axis rotation of the first housing about the second housing) may be implemented by the sub magnet group disposed in the middle along the lengthwise direction of the magnet group among the odd-number of sub magnet groups.

For stable implementation of rotating the first housing 301 and the second housing 401, any one sub magnet group may be allowed to have a much stronger magnetic force than the other sub magnet groups in the same magnet group. For example, the area of the unit magnetized part of the second sub magnet group 322 may be rendered to be larger than the area of the unit magnetized part in the first sub magnet group 321 and rendered to be larger than the area of the unit magnetized part in the third sub magnet group 323. In this case, the area of the unit magnetized part of the fifth sub magnet group 422, corresponding to the second sub magnet group 322, may be rendered to be larger than the area of the unit magnetized part in the fourth sub magnet group 421 and rendered to be larger than the area of the unit magnetized part in the sixth sub magnet group 423. Referring to FIG. 3, the unit magnetized part of the second sub magnet group 322 may be larger in area than the unit magnetized part 321a, 321b, or 321c of the adjacent first sub magnet group 321 and larger in area than the unit magnetized part 323a, 323b, or 323c of the adjacent third sub magnet group 323.

Alternatively, rather than allowing the magnets of the same material to have different areas, different materials of magnets may be used to allow any one sub magnet group to have a much stronger magnetic force than the other sub magnet groups in the same magnet group.

When the first magnet group 320 and the second magnet group 420 each include an odd number of sub magnet groups, a particular sub magnet group of each magnet group (e.g., the sub magnet group positioned in the center of each magnet group) may be allowed to have the strongest magnetic force as compared with the other sub magnet groups therearound. This enables implementation of stabilized rotation as compared with when two magnet groups which are not patterned are positioned adjacent each other.

The first magnet group 320 and the second magnet group 420 may be formed of various types of rotatable magnets. The first magnet group 320 and the second magnet group 420 may be formed of a cylindrical magnet. When the first magnet group 320 and the second magnet group 420 are formed of cylindrical magnets, the magnets in each of the first magnet group 320 and the second magnet group 420 may be aligned in the diameter direction or width direction and may be multipolar-magnetized. Here, multipolar magnetization may refer to a state in which two or a larger even number of N poles and S poles are alternately magnetized on one circumference.

The first magnet group 320 and the second magnet group 420 may be freely rotated (e.g., on-magnet axis rotation) in the first receiving part 315 and the second receiving part 415, respectively.

Structures (e.g., hinge structures 330 and 430) to restrict rotation of an electronic device (e.g., 200 of FIG. 2A) and members (e.g., connecting members 340 and 440) to connect magnets with the hinge structures 330 and 430 are described below with reference to FIGS. 4 to 9B.

Figure 4:
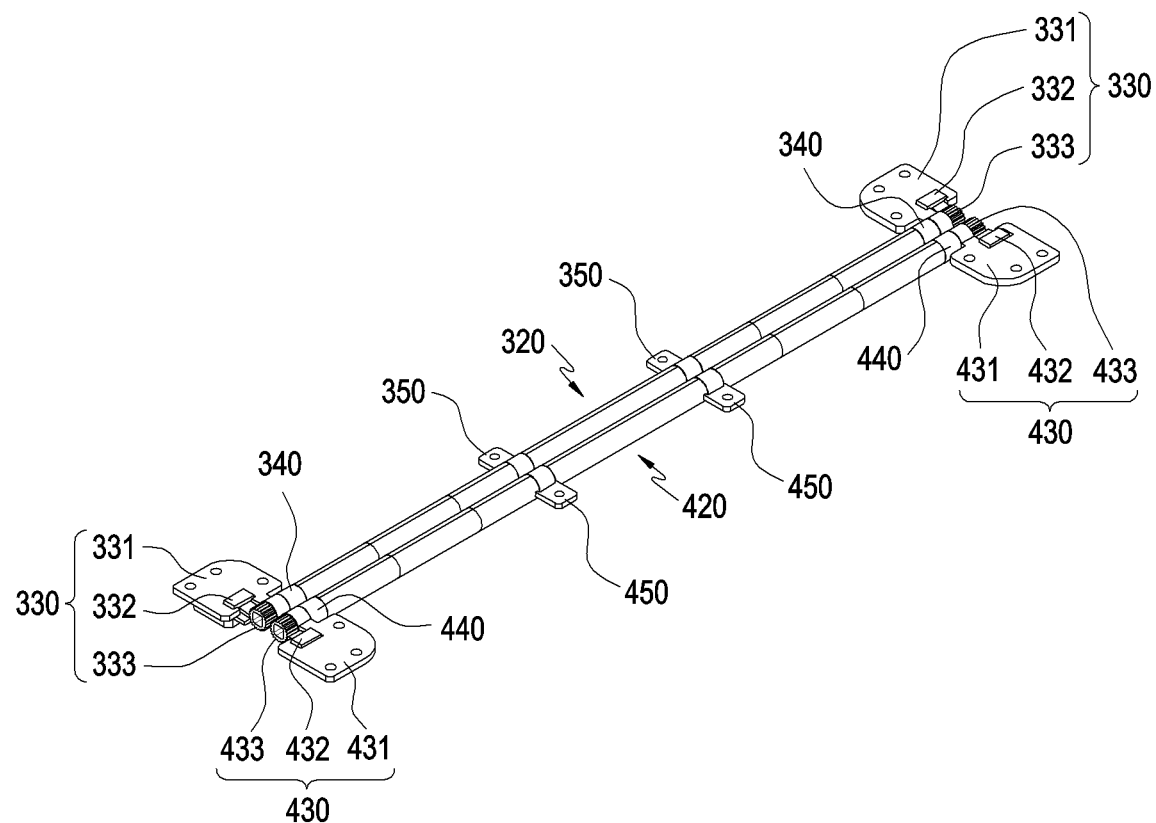
FIG. 4 is a perspective view illustrating magnet groups, hinge structures, and connecting members, according to an embodiment.

FIG. 4 is a perspective view illustrating magnet groups 320 and 420, hinge structures 330 and 430, and connecting members 340 and 440, according to an embodiment.

Figure 5:
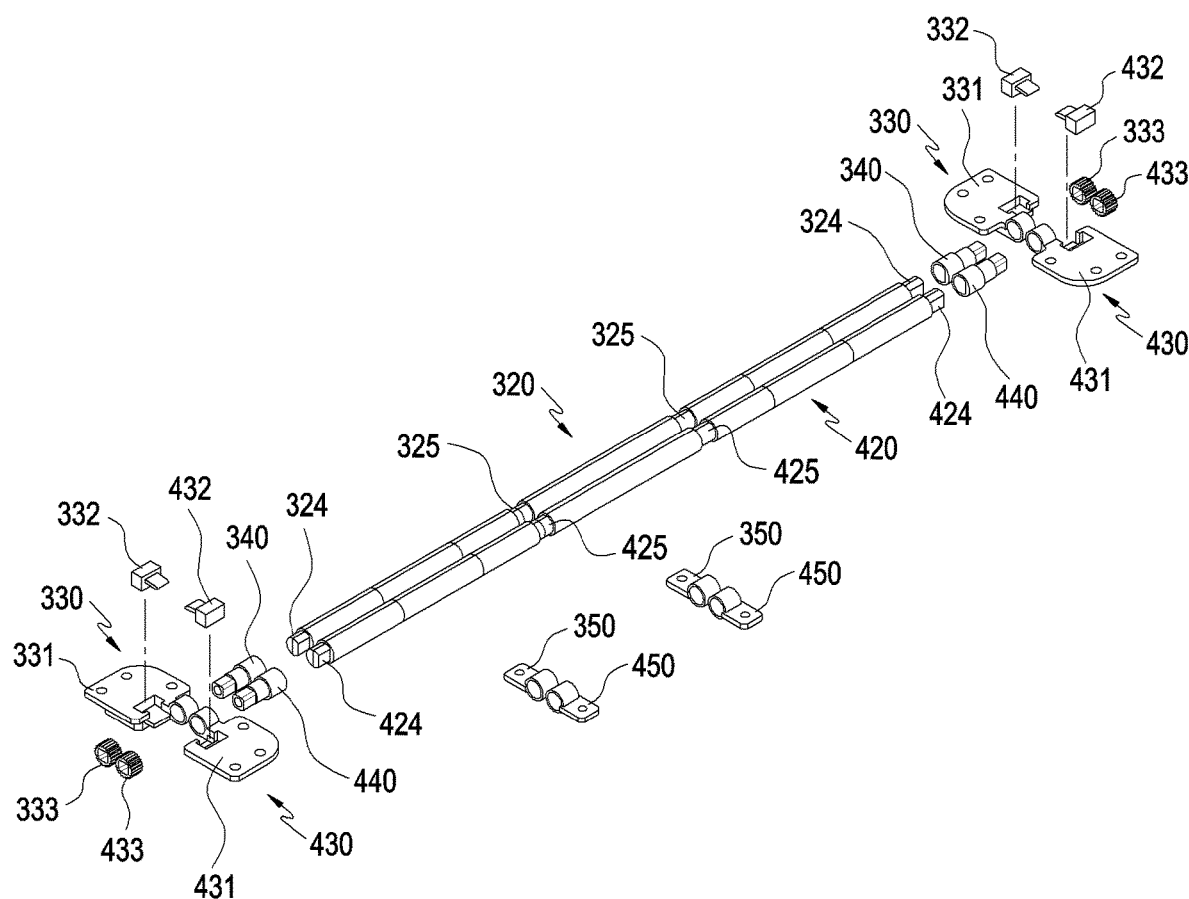
FIG. 5 is an exploded perspective view illustrating the components of FIG. 4, according to an embodiment.

FIG. 5 is an exploded perspective view illustrating the components of FIG. 4, according to an embodiment.

Figure 6:
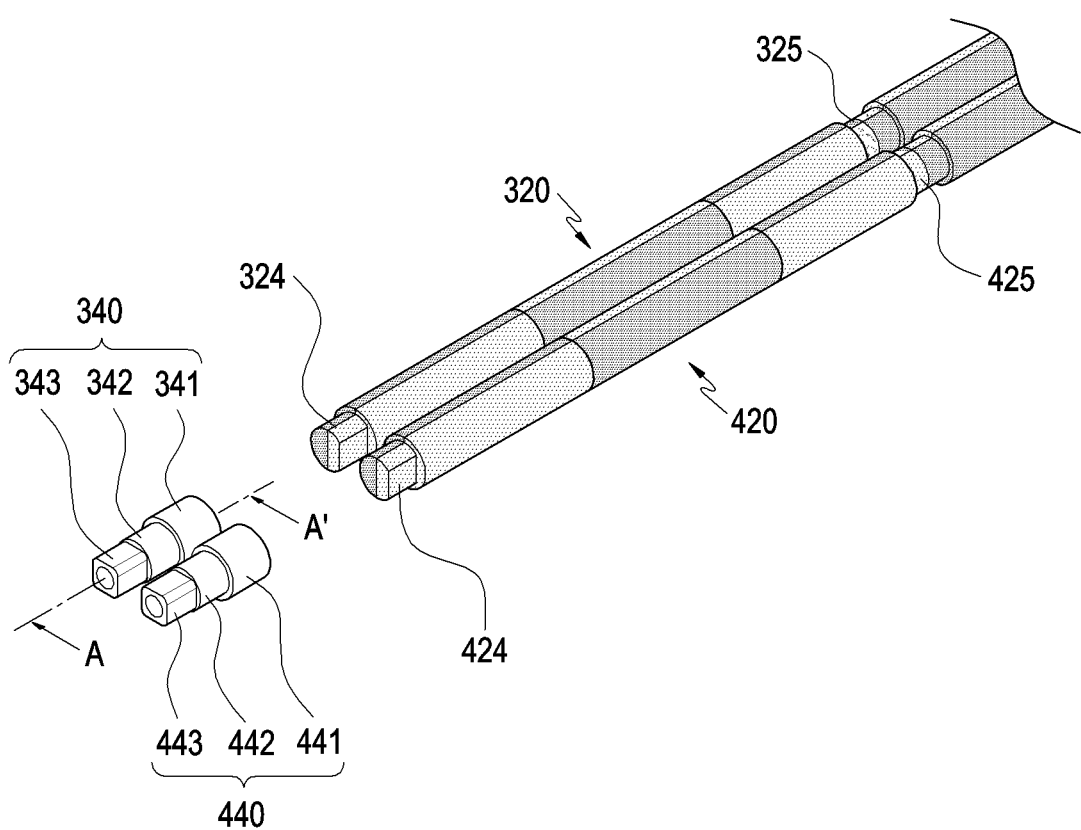
FIG. 6 is a perspective view illustrating steps of magnet groups and connecting members coupled to the steps, according to an embodiment.

FIG. 6 is a perspective view illustrating steps 324 and 424 of magnet groups 320 and 420 and connecting members 340 and 440 coupled to the steps 324 and 424, according to an embodiment.

Figure 7A:
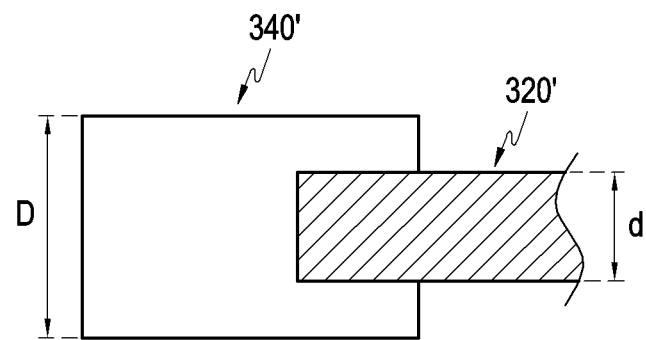
FIG. 7A is a view illustrating a magnet and a connecting member surrounding the magnet, according to an embodiment.

FIG. 7A is a view illustrating a magnet 320' and a connecting member 340' surrounding one end of the magnet 320', according to an embodiment.

Figure 7B:
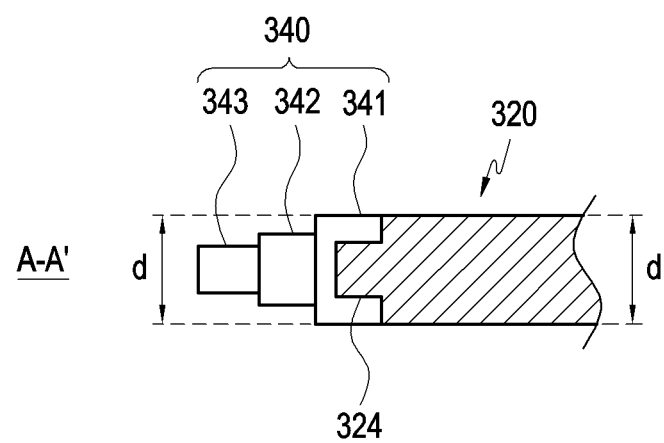
FIG. 7B is a cross-sectional view taken along line A-A' of the components of FIG. 6, according to an embodiment.

FIG. 7B is a cross-sectional view taken along line A-A' of an assembly of the components of FIG. 6.

Referring to FIGS. 4 and 5, a first electronic device may include first hinge structures 330 disposed inside the first housing 301 and not to be viewed from the outside. As shown in FIGS. 4 and 5, the first hinge structures 330 may be disposed at both ends of the first magnet group 320. The second electronic device may include second hinge structures 430 corresponding to the first electronic device. The second hinge structures 430 may be disposed inside the second housing 401 and not to be viewed from the outside. The second hinge structure 430 may be disposed at both ends of the second magnet group 420.

The first hinge structures 330 may include a first fixing member 331, a first stopper 332, and a first gear 333, and the second hinge structures 430 may include a second fixing member 431, a second stopper 432, and a second gear 433.

The first magnet group 320 and the first hinge structures 330 may be connected together via first connecting members 340. The second magnet group 420 and the second hinge structures 430, corresponding to the first magnet group 320 and the first hinge structures 330, may be connected together via second connecting members 440. The magnet groups 320 and 420 may be connected to the hinge structures 330 and 430 not directly but via the connecting members 340 and 440. The magnet groups 320 and 420 may be formed of metal and be magnetized by a designated pattern, and the connecting members 340 and 440 physically contacting the magnet groups 320 and 420 may be formed of a material containing a non-magnetized metal (e.g., a steel use stainless (SUS)).

The first connecting member 340 may have a hole at one side thereof to couple one end of the first magnet group 320 to the connecting member 340 so that when the first connecting member 340 is coupled with the first magnet group 320, the first magnet group 320 may be surrounded by the hole of the first connecting member 340 to fix the first magnet group 320. The second connecting member 440 may have a hole at one side thereof to couple one end of the second magnet group 420 to the connecting member 440 so that when the second connecting member 440 is coupled with the second magnet group 420, the second magnet group 420 may be surrounded by the hole of the second connecting member 440 to fix the second magnet group 420.

Referring to FIG. 6, one end of the first connecting member 340 may be connected to the first hinge structure 330, and one end of the second connecting member 440 may be connected to the second hinge structure 430.

At least one first step 324 formed on one end of the first magnet group 320 and at least one second step 424 formed at one end of the second magnet group 420 may have a D cut-shaped cross section. The first connecting member 340 and the second connecting member 440 may have a hole with a shape corresponding to the D cut shape to prevent the magnet groups 320 and 420 connected with the connecting members 340 and 440 from idling.

Referring to FIG. 7A, when the electronic device has a magnet 320' with no step and a connecting means 340' to fix the magnet, the connecting means 340' may be formed to have a larger thickness (e.g., D) than the thickness (e.g., d) of the magnet 320'. In this case, since the thickness of the electronic device needs to be as thick as, at least, the connecting means 340', it may be limited to make the electronic device as compact as possible.

On the contrary, referring to FIG. 7B, when the electronic device has a magnet 320 with a step 324 and a connecting member 340 with a shape corresponding to the step 324, the connecting member 340 may be configured to have the same thickness d as the thickness d of the magnet 320. The thickness of the electronic device may be reduced to the thickness d of the magnet 320 and, thus, the electronic device may advantageously be made compact.

Figure 8:
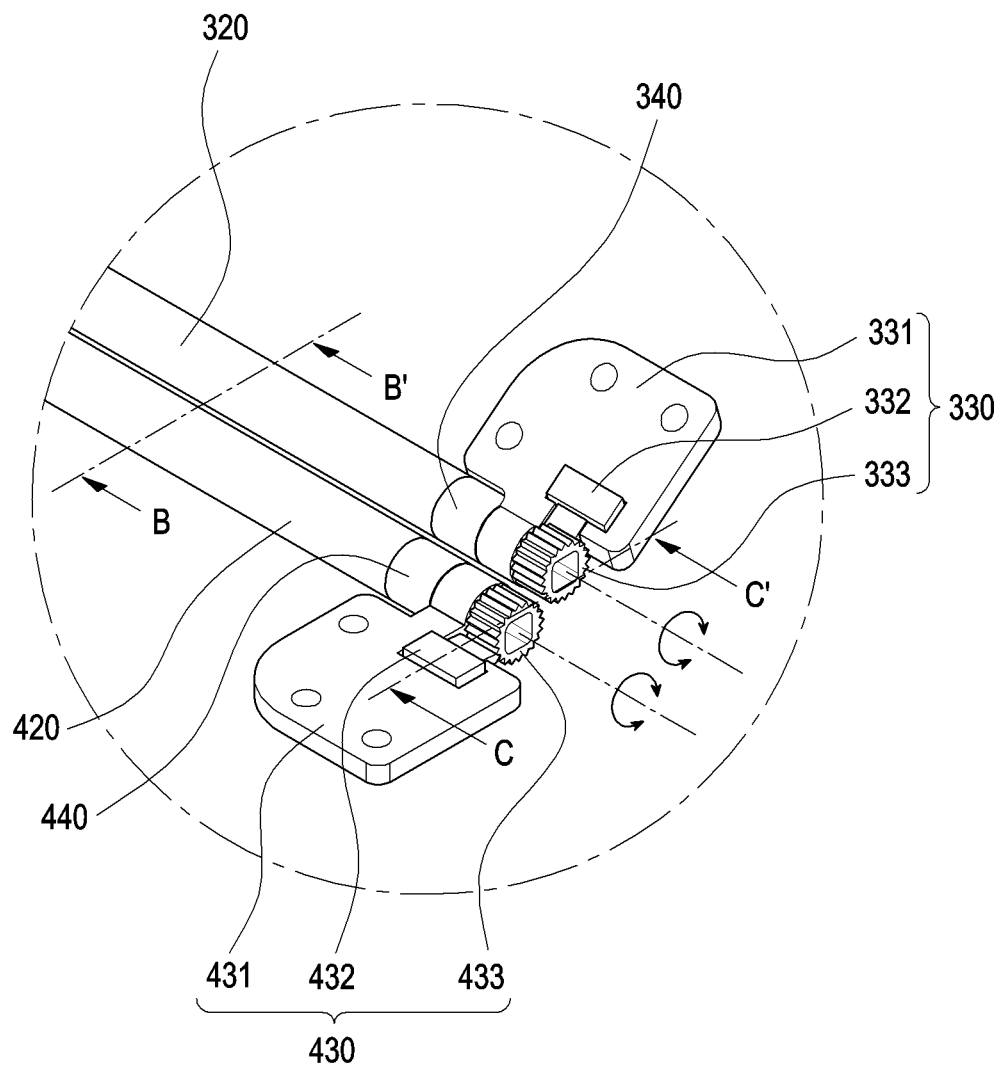
FIG. 8 is an enlarged view of portion A of the electronic device of FIG. 2A, according to an embodiment.

FIG. 8 is an enlarged view of portion A of the electronic device 200 of FIG. 2A, according to an embodiment.

Figure 9A:
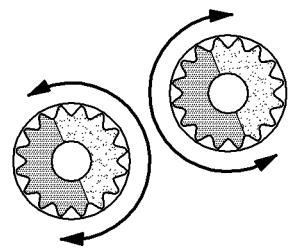
FIG. 9A is a cross-sectional view taken along line B-B' of the components of FIG. 8, according to an embodiment.

FIG. 9A is a cross-sectional view taken along line B-B' of the components of FIG. 8, according to an embodiment.

Figure 9B:
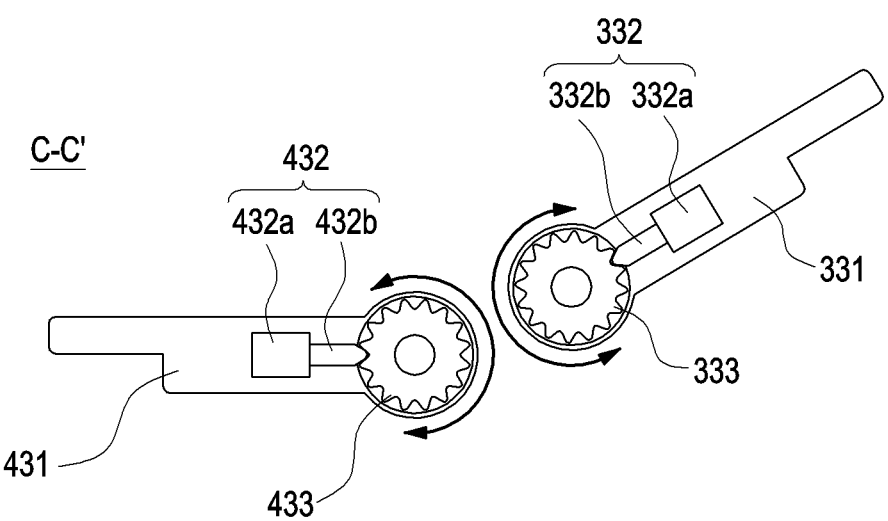
FIG. 9B is a cross-sectional view taken along line C-C' of the components of FIG. 8, according to an embodiment.

FIG. 9B is a cross-sectional view taken along line C-C' of the components of FIG. 8, according to an embodiment.

Referring to FIG. 8, a first fixing member 331 and a second fixing member 431 may have a plate-shaped structure and provide spaces for receiving a first stopper 332 and a second stopper 432. The first stopper 332 and the second stopper 432 may be mounted and fastened in the spaces of the first fixing member 331 and the second fixing member 431 and be engaged with the first gear 333 and the second gear 433, respectively. The first fixing member 331 and the second fixing member 431 may be fastened in the first housing 301 and the second housing 401, respectively, by a coupling means, e.g., screws or rivets, thereby supporting the first stopper 332 and the second stopper 432.

The first stopper 332 and the second stopper 432 may be mounted and fastened in the first housing 301 and the second housing 401 on their own without relying on the first fixing member 331 and the second fixing member 431. Even in this case, at least one end of the first stopper 332 and at least one end of the second stopper 432 may be engaged with the first gear 333 and the second gear 433, respectively.

Referring to FIGS. 4 to 8, the arm of the first fixing member 331 and the first gear 333 may be sequentially arranged along the lengthwise direction of the first connecting member 340, and the arm of the second fixing member 431 and the second gear 433 may be sequentially arranged along the lengthwise direction of the second connecting member 440. The inner circumference of the first gear 333 may be coupled with one end of the first connecting member 340 without idling, and the inner circumference of the second gear 433 may be coupled with one end of the second connecting member 440 without idling. The first gear 333 and the second gear 433 may be formed of the same material, e.g., an alloy such as an SUS, as the first connecting member 340 and the second connecting member 440.

Referring to FIGS. 9A and 9B, the first stopper 332 may include a first body part 332a and a first pin 332b, and the second stopper 432 may include a second body part 432a and a second pin 432b. Portions of the first stopper 332 and the second stopper 432, which include, at least, the first pin 332b and the second pin 432b, may be formed of an elastic material.

As shown in FIGS. 9A and 9B, when the first magnet group 320 rotates clockwise or counterclockwise, the first hinge structure may be rotated in the same direction as the first magnet group 320. In this case, as a larger force than the elasticity of the first stopper 332 is applied to the first hinge structure so that the first pin 332b is moved along the circumference of the first gear 333, the angle between the first electronic device and the second electronic device may be adjusted.

The first connecting member 340 and/or the first gear 333 may be formed of an alloy, and the portion of the first stopper 332 connected thereto, which includes the first pin 332b may include an elastic material. When the first pin 332b of the first stopper 332 is moved along the circumference of the first gear 333 and/or the first connecting member 340, the first pin 332b may elastically pressurize the first gear 333 and/or the first connecting member 340. For example, when the user moves the first housing 301 to adjust the angle formed between the first housing 301 and the second housing 401, the first pin 332b may be moved back a very little bit and thus be moved along the outer circumference of the first gear 333 and/or the first connecting member 340. When the user stops moving the first housing 301, the first pin 332b may go back to its original position, thus limiting the movement of the first housing 301 by the first stopper 332. The above-described embodiment may apply likewise to the second stopper 432, the second connecting member 440, and/or the second gear 433.

Referring to FIGS. 8, 9A, and 9B, the first stopper 332 may permit rotation of the first housing 301 while maintaining the magnetic force between the first magnet group 320 and the second magnet group 420 when the first housing rotates on the second housing. The first stopper 332 is included in the first housing and may thus be rotated along with the first housing 301 when the first housing 301 rotates. When the first housing 301 stops rotating, the first stopper 332 may remain stuck to the first gear 333 and/or the first connecting member 340 to maintain the angle between the front surface of the first housing 301 and the front surface of the second housing. The first stopper 332 may prevent the first magnet group 320 from rotating due to the gravity applied to the first housing 301. The force to allow the first stopper 332 to remain stuck to the first connecting member 340 and/or the first gear 333 is designed to be larger than the gravity applied to the first housing 301, thereby limiting free rotation of the first magnet group 320. The first stopper 332 may also maintain the magnetic force of the first magnet group 320 and the second magnet group 420 when the first housing 301 is rotated as intended by the user. The above-described embodiment may likewise apply to the second stopper 432.

Various hinge operations (e.g., on-contact point axis rotation) of the first electronic device 300 and the second electronic device 400 are described below with reference to FIGS. 10A to 12B.

Figure 10A:
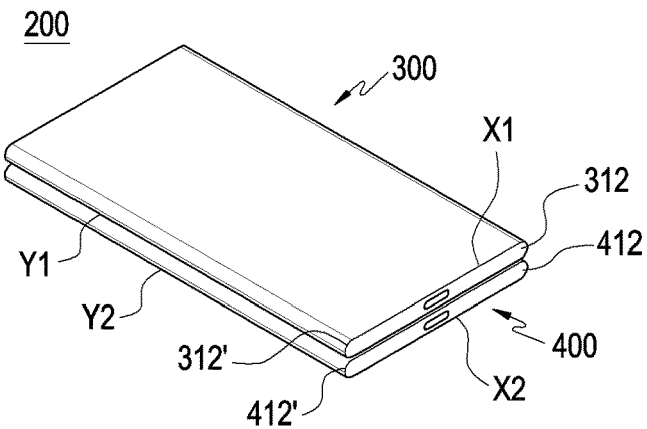
FIGS. 10A-10D are views illustrating various hinge operations (e.g., on-magnet axis rotation) of a first electronic device and a second electronic device, according to an embodiment.

FIGS. 10A to 10D are a view illustrating various hinge operations (e.g., on-magnet axis rotation) of a first electronic device 300 and a second electronic device 400, according to an embodiment. On-magnet axis rotation may mean rotation about an axis parallel with the vertical length Y1 or Y2 of the electronic device 200 as shown in FIG. 10A.

FIG. 10A illustrates a folded position of the first electronic device 300 and the second electronic device 400, with the rear surface of the first electronic device 300 contacting the rear surface of the second electronic device 400, according to an embodiment. Alternatively, the first electronic device 300 and the second electronic device 400 may be folded on each other, with the front surface of the first electronic device 300 contacting the front surface of the second electronic device 400.

The first electronic device 300 and second electronic device 400 of the electronic device 200 may remain folded on each other by the mutual attraction between the first magnet group and the second magnet group.

When the first electronic device 300 is rotated and folded on the second electronic device 400, the first magnet group 320 may be rotated inside the first receiving part so that the first pole (e.g., N pole or S pole) of the first magnet group faces the second pole of the second magnet group. When the first electronic device 300 is fully folded on the second electronic device 400 as shown in FIG. 10A, the first pin may be engaged with the first gear, limiting further rotation of the first magnet group 320.

Figure 10B:
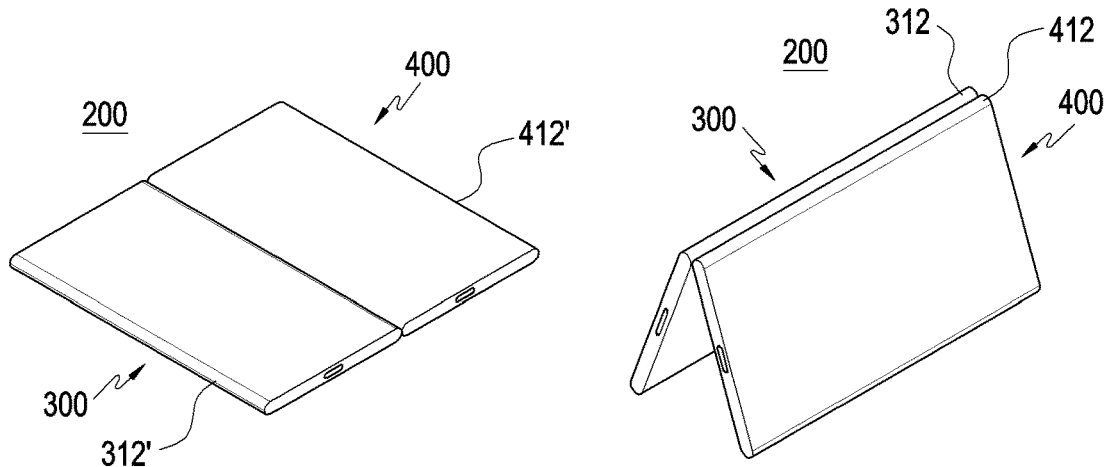

FIG. 10B illustrates a fully unfolded position of the first electronic device 300 and the second electronic device 400 so that the angle between the front surface of the first electronic device 300 and the front surface of the second electronic device 400 is 180 degrees.

In the electronic device 200, the first electronic device 300 may be rotated 180 degrees with respect to the second electronic device 400 while maintaining a connection between the first housing and the second housing by the magnetic force between the first magnet group and the second magnet group.

When the first electronic device 300 is rotated about 180 degrees with respect to the second electronic device 400, the first magnet group 320 may be rotated inside the first receiving part so that the first pole (e.g., N pole or S pole) of the first magnet group faces the second pole (e.g., S pole or N pole) of the second magnet group.

The first display device of the first electronic device 300 and the second display device of the second electronic device 400 may be unfolded from each other to be positioned parallel with each other. Thus, a first image (or a first video) displayed on the first display device 313 and a second image (or a second video) displayed on the second display device 413 may be merged into a single screen.

Figure 10C:
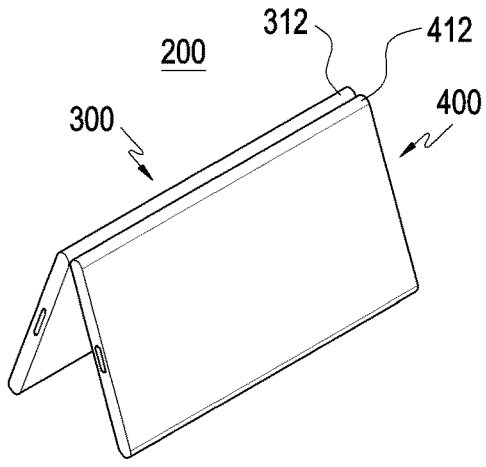

FIG. 10C illustrates a position of the electronic device 200 propped on the floor by a side surface of the first electronic device 300 and a side surface of the second electronic device 400, with an obtuse angle formed between the front surface of the first electronic device 300 and the front surface of the second electronic device 400.

Referring to FIG. 10C, the electronic device 200 may remain in the "A" shape in which state the user may use the electronic device 200. The user may view the image (or video) provided through the first display device and/or the second display device at a desired inclined angle by adjusting the angle between the first electronic device 300 and the second electronic device 400.

In the electronic device 200, the first housing and the second housing may remain connected to each other by the mutual attraction between the first magnet group and the second magnet group.

The first electronic device 300 may be rotated to be inclined on the second electronic device 400. In this case, the first magnet group 320 may also be rotated inside the first receiving part so that the first pole (e.g., N pole or S pole) of the first magnet group faces the second pole (e.g., S pole or N pole) of the second magnet group.

When rotation is stopped with a predetermined angle formed between the front surface of the first electronic device 300 and the front surface of the second electronic device 400 as shown in FIG. 10C, the first pin of the first stopper may be engaged with the first gear, limiting further rotation of the first magnet group 320.

Figure 10D:
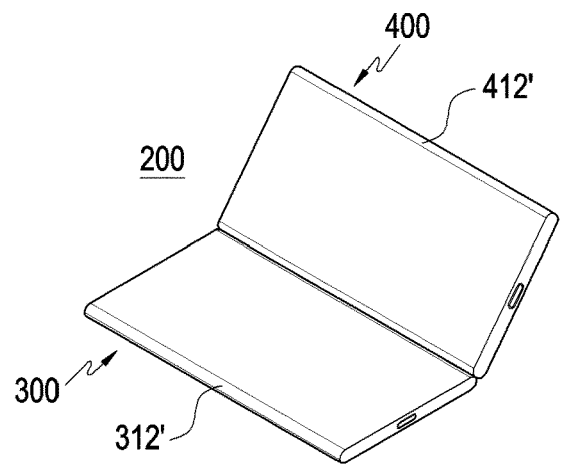

FIG. 10D illustrates a position of the electronic device 200 while propped on the floor by the rear surface of the first electronic device 300, with the rear surface of the second electronic device 400 spaced apart from the floor and an acute angle formed between the front surface of the first electronic device 300 and the front surface of the second electronic device 300.

Referring to FIG. 10D, the user may use the electronic device 200 with the rear surface of the second electronic device 400 spaced apart from the floor. The user may simultaneously receive images (or videos) from the first electronic device 300 and/or the second electronic device 400. A keyboard may be displayed on the first electronic device 300, and an image (or video) may be displayed on the second electronic device 400 so that input on the keyboard by the user and output may simultaneously be implemented on the two different electronic devices 300 and 400.

In the position of the electronic device 200 shown in FIG. 10D, the first housing and the second housing may also remain connected to each other by the mutual attraction between the first magnet group and the second magnet group.

The angle may be adjusted by further rotating the second electronic device 400, with the second electronic device 400 inclined and resting on the first electronic device 300. In this case, the first magnet group 320 may also be rotated inside the first receiving part so that the first pole (e.g., N pole or S pole) of the first magnet group faces the second pole (e.g., S pole or N pole) of the second magnet group.

The second stopper may prevent the second housing from rotating due to gravity, with a predetermined angle (e.g., an acute angle) formed between the second electronic device 400 and the first electronic device 300, thus allowing the second electronic device 400 to remain inclined and coupled to the first housing 301.

Referring to FIG. 10D, the above-described embodiments may apply where the rear surface of the second electronic device 400 is propped on the floor while the rear surface of the first electronic device 300 is spaced apart from the floor.

Figure 11:
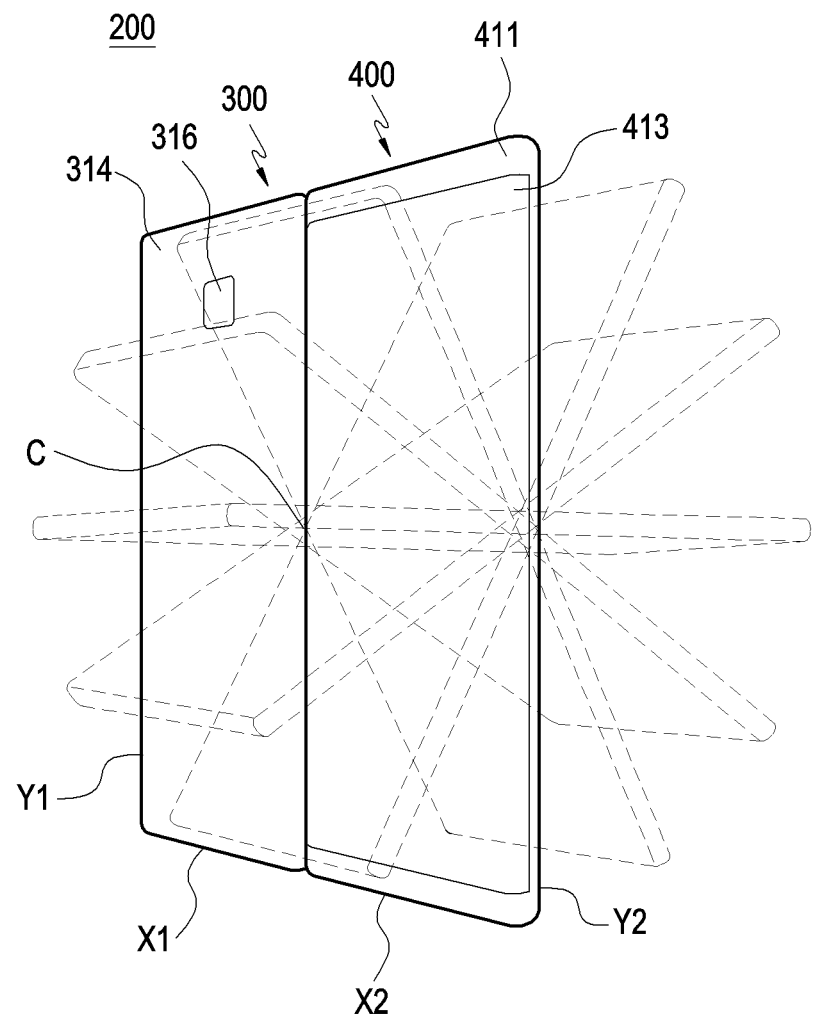
FIG. 11 is a view illustrating various hinge operations (e.g., rotation on a contact point axis) of a first electronic device and a second electronic device, according to an embodiment.

FIG. 11 is a view illustrating various hinge operations (e.g., on-contact point axis rotation) of the first electronic device 300 and the second electronic device 400, according to an embodiment. On-contact point axis rotation may mean rotation on an axis (which is parallel with the horizontal length X1 or X2) passing through a contact point C of the electronic device 200.

Referring to FIG. 11, the first electronic device 300 and the second electronic device 400 are capable of on-contact axis rotation as well as on-magnet axis rotation. The second electronic device 400 (or the first electronic device) may be rotated on an axis parallel with the horizontal axis of the first electronic device 300 (or the second electronic device), with a fixed contact point C formed between a portion of a first side surface of the first housing and a portion of a second side surface of the second housing. This may allow the user to freely turn the front surface and rear surface of the first electronic device 300 and/or the second electronic device 400 while operating the electronic device 200.

For example, in a case where a camera module 316 is mounted on the rear surface 314 of the first electronic device 300, the second electronic device 400 may be rotated on the contact point (C) axis (e.g., an axis parallel with the horizontal axis of the first electronic device 300). In this case, a user's selfie may be output through the second display device 413 of the second electronic device 400 while simultaneously allowing the camera module 316 of the first electronic device 300 to face the user's face. Thus, the user may take a selfie in a more comfortable manner.

Figure 12A:
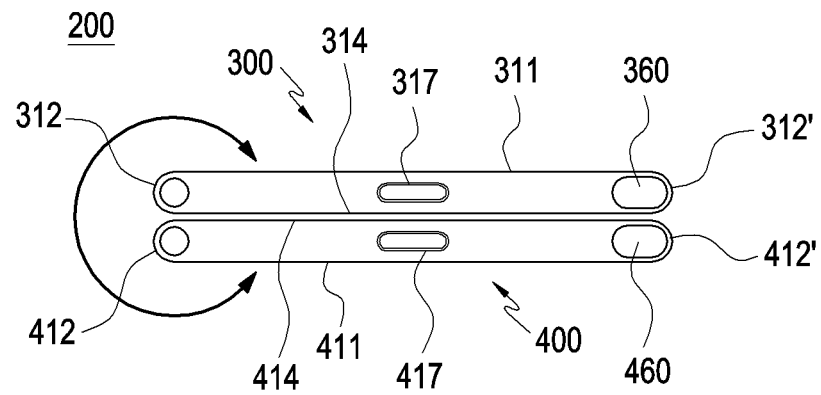
FIG. 12A is a view illustrating a folded position of a first electronic device and a second electronic device, according to an embodiment.

FIG. 12A is a view illustrating a folded position of the first electronic device 300 and the second electronic device 400, according to an embodiment.

Figure 12B:
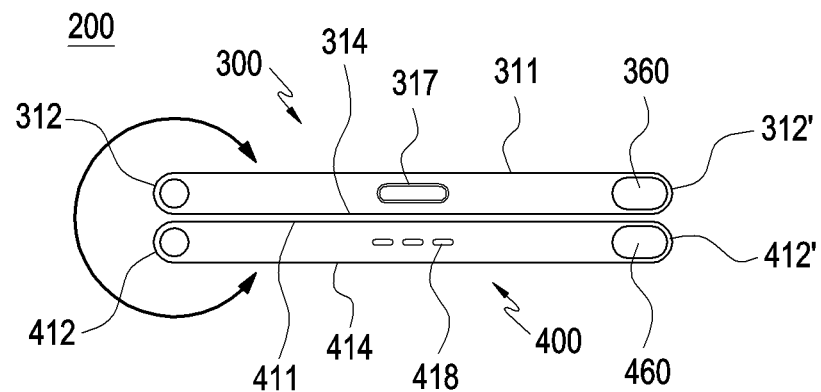
FIG. 12B is a view illustrating a folded position of a first electronic device and a second electronic device, according to an embodiment that is different from the embodiment of FIG. 12A.

FIG. 12B is a view illustrating a folded position of the first electronic device 300 and the second electronic device 400, according to a different embodiment from that shown in FIG. 12A.

Referring to FIGS. 12A and 12B, the area of contact between the first electronic device 300 and the second electronic device 400 may be varied when the first electronic device 300 and the second electronic device 400 are folded on each other. The rear surface 314 of the first electronic device 300 may contact the rear surface 414 of the second electronic device 400. Alternatively, the rear surface 314 of the first electronic device 300 may contact the front surface 411 of the second electronic device 400. This may be implemented by rotating the first electronic device 300 or the second electronic device according to on-contact point axis rotation as described above in connection with FIG. 11 and then folding the first electronic device 300 on the second electronic device 400.

A first auxiliary magnet 360 may be provided on a third side surface 312' which faces away from the first side surface 312 of the first electronic device 300. A second auxiliary magnet 460 may be provided on a fourth side surface 412' which faces away from the second side surface 412 of the second electronic device 400. Thus, when used in the folded position, the first electronic device 300 and the second electronic device 400 may remain stable in the folded position without leaving a gap between the first electronic device 300 and the second electronic device 400.

According to an embodiment, an electronic device with magnets comprises a first housing including a first side surface, a second housing including a second side surface that may face the first side surface, a first magnet group disposed adjacent to the first side surface in the first housing and patterned along a lengthwise direction, and a second magnet group disposed adjacent to the second side surface in the second housing and patterned along a lengthwise direction. The patterned first magnet group and the patterned second magnet group may be alternately magnetized with an N pole or an S pole. The first housing and the second housing may be coupled together to be rotatable by the first magnet group and the second magnet group.

The first magnet group may include at least one odd number of sub magnet groups, and the second magnet group may include at least one odd number of sub magnet groups.

The first magnet group may include a first sub magnet group, a second sub magnet group, and a third sub magnet group, and the second magnet group may include a fourth sub magnet group aligned to form an attracting force corresponding to the first sub magnet group, a fifth sub magnet group aligned to form an attracting force corresponding to the second sub magnet group, and a sixth sub magnet group aligned to form an attracting force corresponding to the third sub magnet group. The first housing and the second housing may be coupled together to be rotatable by the attracting forces of the second sub magnet group and the first sub magnet group.

A magnetic force of the second sub magnet group may be larger than magnetic forces of the first sub magnet group and the third sub magnet group, and a magnetic force of the fifth sub magnet group may be larger than magnetic forces of the fourth sub magnet group and the sixth sub magnet group.

At least one unit magnetized part of the second sub magnet group may be formed to be larger in area than a unit magnetized part included in the first sub magnet group and to be larger in area than a unit magnetized part included in the third sub magnet group, and at least one unit magnetized part of the fifth sub magnet group may be formed to be larger in area than a unit magnetized part included in the fourth sub magnet group and to be larger in area than a unit magnetized part included in the sixth sub magnet group. The first magnet group may be freely rotated inside the first housing, and the second magnet group may be freely rotated inside the second housing.

The first magnet group and the second magnet group may be formed of a cylindrical magnet.

The first housing may include a first receiving part to receive the first magnet group, and the second housing may include a second receiving part to receive the second magnet group.

The electronic device may include a first hinge structure including a first stopper disposed in the first housing to limit rotation of the first magnet group and a second hinge structure including a second stopper disposed in the second housing to limit rotation of the second magnet group.

The first surface and the second stopper may be formed of a magnetic material.

The second stopper may permit rotation of the second magnet group to produce a magnetic force together with the first magnet group when the first housing rotates about the second housing on a magnet axis. The first stopper may remain stuck about the first magnet group to maintain an angle formed between a front surface of the first housing and a front surface of the second housing when the first stopper rotates along with the first housing.

The first stopper may permit rotation of the first housing in a direction along which magnetic forces of the first magnet group and the second magnet group are produced.

First steps may be formed at two opposite ends of the first magnet group, and second steps may be formed at two opposite ends of the second magnet group. The electronic device may further comprise first connecting members coupled with the first steps to fix the first magnet group to the first housing, second connecting members coupled with the second steps to fix the second magnet group to the second housing, first fixing members surrounding the outer circumference of at least part of the first connecting members to provide a space to receive the first stopper, and second fixing members surrounding the outer circumference of at least part of the second connecting members to provide a space to receive the second stopper.

The first step and the second step may have a D cut-shaped cross section.

The electronic device may further comprise a first supporting member coupled to at least one first recess formed in an outer circumference of at least a portion between two opposite ends of the first magnet group to support a side of the first magnet group and a second supporting member coupled to at least one second recess formed in an outer circumference of at least a portion between two opposite ends of the second magnet group to support a side of the second magnet group.

The first housing may include a first auxiliary magnet on a third side surface positioned opposite the first side surface, and the second housing may include a second auxiliary magnet on a fourth side surface positioned opposite the second side surface.

According to an embodiment, an electronic device comprises a first housing including a first side surface, a second housing including a second side surface that may face at least a portion of the first side surface, a first magnet group disposed adjacent to the first side surface in the first housing, a second magnet group disposed adjacent to the second side surface in the second housing, a first connecting member disposed in the first housing and connected with at least one end of the first magnet group to fix the first magnet group to the first housing, a second connecting member disposed in the second housing and connected with at least one end of the second magnet group to fix the second magnet group to the second housing, a first stopper including an elastic material and disposed in the first housing to limit rotation of the first magnet group, and a second stopper including an elastic material and disposed in the second housing to limit rotation of the second magnet group.

A gear to which the first stopper may be stuck may be formed in an outer circumference of the first connecting member, and a gear to which the second stopper may be stuck may be formed in an outer circumference of the second connecting member.

A first step having a D cut-shaped cross section may be formed at, at least, one of two opposite ends of the first magnet group, and a second step having a D cut-shaped cross section may be formed at, at least, one of two opposite ends of the second magnet group. The first connecting member may be coupled with the first step, and the second connecting member may be coupled with the second step.

According to an embodiment, an electronic device comprises a first housing including a first side surface, a second housing including a second side surface that may face at least a portion of the first side surface, a first magnet group disposed adjacent to the first side surface in the first housing, a second magnet group disposed adjacent to the second side surface in the second housing, a first connecting member disposed in the first housing and connected with at least one end of the first magnet group to fix the first magnet group to the first housing, a second connecting member disposed in the second housing and connected with at least one end of the second magnet group to fix the second magnet group to the second housing, a first supporting member coupled to at least one first recess formed in an outer circumference of at least a portion between two opposite ends of the first magnet group to support a side of the first magnet group, and a second supporting member coupled to at least one second recess formed in an outer circumference of at least a portion between two opposite ends of the second magnet group to support a side of the second magnet group.

When the first magnet group includes a plurality of sub magnet groups, the first recess may be formed in a boundary between the plurality of sub magnet groups, and when the second magnet group includes a plurality of sub magnet groups, the second recess may be formed in a boundary between the plurality of sub magnet groups.

As is apparent from the foregoing description, according to various embodiments of the disclosure, there may be provided an electronic device with magnets, which may couple the first housing and the second housing together to be rotatable about each other without a hinge structure which is exposed to the outside of the housing using a magnetic force formed between the first magnet group and the second magnet group. This may enhance the overall look of the electronic device.

According to various embodiments of the disclosure, the electronic device with magnets may enable stable on-contact point axis rotation as well as on-magnet axis rotation.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:
1. An electronic device, comprising:
a first housing including a first side surface;
a second housing including a second side surface that is capable of facing at least a portion of the first side surface;
a first magnet group disposed adjacent to the first side surface in the first housing and including a plurality of sub magnet groups disposed in a first designated pattern along a lengthwise direction of the first magnet group; and
a second magnet group disposed adjacent to the second side surface in the second housing and including a second designated pattern along a lengthwise direction of the second magnet group,
wherein the first designated pattern of the first magnet group and the second designated pattern of the second magnet group are alternately magnetized with an N pole or an S pole,
wherein the first housing and the second housing are coupled together to be rotatable with at least a portion of the first housing and the second housing attached by an attracting force applied between the first magnet group and the second magnet group, and
wherein at least one sub magnet group included in the plurality of sub magnet groups has a stronger magnetic force than another sub magnet group included in the plurality of sub magnet groups.

2. The electronic device of claim 1, wherein the first magnet group includes an odd-number of sub magnet groups, and the second magnet group includes an odd-number of sub magnet groups.

3. The electronic device of claim 2, wherein the first magnet group includes a first sub magnet group, a second sub magnet group, and a third sub magnet group, and the second magnet group includes a fourth sub magnet group aligned to form an attracting force corresponding to the first sub magnet group, a fifth sub magnet group aligned to form an attracting force corresponding to the second sub magnet group, and a sixth sub magnet group aligned to form an attracting force corresponding to the third sub magnet group, and wherein the first housing and the second housing are coupled together to be rotatable by the attracting forces of the second sub magnet group and the first sub magnet group.

4. The electronic device of claim 3, wherein a magnetic force of the second sub magnet group is larger than magnetic forces of the first sub magnet group and the third sub magnet group, and a magnetic force of the fifth sub magnet group is larger than magnetic forces of the fourth sub magnet group and the sixth sub magnet group.

5. The electronic device of claim 3, wherein a unit magnetized part of the second sub magnet group is formed to be larger in area than a unit magnetized part included in the first sub magnet group and to be larger in area than a unit magnetized part included in the third sub magnet group, and a unit magnetized part of the fifth sub magnet group is formed to be larger in area than a unit magnetized part included in the fourth sub magnet group and to be larger in area than a unit magnetized part included in the sixth sub magnet group.

6. The electronic device of claim 1, wherein the first magnet group and the second magnet group are formed of a cylindrical magnet.

7. The electronic device of claim 1, wherein the first magnet group is received in a first receiving part of the first housing to be freely rotatable, and the second magnet group is received in a second receiving part of the second housing to be freely rotatable.

8. The electronic device of claim 1, further comprising:
a first hinge structure including a first stopper disposed in the first housing to limit rotation of the first magnet group and a first fixing member providing a space to receive the first stopper; and
a second hinge structure including a second stopper disposed in the second housing to limit rotation of the second magnet group and a second fixing member providing a space to receive the second stopper.

9. The electronic device of claim 8, wherein the first stopper and the second stopper are formed of an elastic material.

10. The electronic device of claim 8, wherein the second stopper is configured to permit rotation of the second magnet group to produce a magnetic force together with the first magnet group when the first housing rotates about the second housing on a magnet axis, and wherein the first stopper is configured to remain stuck to a first gear disposed on an axis of the first magnet group to maintain an angle formed between a front surface of the first housing and a front surface of the second housing when the first stopper rotates along with the first housing.

11. The electronic device of claim 8, wherein the first stopper is configured to rotate in a direction along which a magnetic force between the first magnet group and the second magnet group is maintained when the first housing rotates about the second housing.

12. The electronic device of claim 8, wherein a first step is formed at, at least, one of two opposite ends of the first magnet group, and a second step is formed at, at least, one of two opposite ends of the second magnet group, and wherein the electronic device further comprises a first connecting member coupled with the first step to fix the first magnet group to the first housing and a second connecting member coupled with the second step to fix the second magnet group to the second housing.

13. The electronic device of claim 12, wherein the first step and the second step have a D cut-shaped cross section.

14. The electronic device of claim 1, further comprising:
a first supporting member coupled to at least one first recess formed in an outer circumference of at least a portion between two opposite ends of the first magnet group to support a side of the first magnet group; and
a second supporting member coupled to at least one second recess formed in an outer circumference of at least a portion between two opposite ends of the second magnet group to support a side of the second magnet group.

15. The electronic device of claim 1, wherein the first housing includes a first auxiliary magnet on a third side surface positioned opposite the first side surface, and the second housing includes a second auxiliary magnet on a fourth side surface positioned opposite the second side surface.

16. An electronic device, comprising:
a first housing including a first side surface;
a second housing including a second side surface that is capable of facing at least a portion of the first side surface;
a first magnet group disposed adjacent to the first side surface in the first housing;
a second magnet group disposed adjacent to the second side surface in the second housing;
a first hinge structure disposed inside the first housing and not viewable from outside the first housing;
a second hinge structure disposed inside the first housing and not viewable from outside the first housing;
a first connecting member disposed in the first housing and connected with at least one end of the first magnet group to fix the first magnet group to the first housing; and
a second connecting member disposed in the second housing and connected with at least one end of the second magnet group to fix the second magnet group to the second housing,
wherein the first hinge structure includes a first stopper including an elastic material and disposed in the first housing to limit rotation of the first connecting member and a first gear coupled with one end of the first connecting member,
wherein the second hinge structure includes a second stopper including an elastic material and disposed in the second housing to limit rotation of the second connecting member and a second gear coupled with one end of the second connecting member,
wherein the first gear is disposed adjacent to the second gear when the first housing rotates with respect to the second housing about an axis parallel with the first side surface, and
wherein the first gear is not disposed adjacent to the second gear when the first housing rotates with respect to the second housing about an axis orthogonal with the first side surface on a fixed contact point.

17. The electronic device of claim 16, wherein a gear to which the first stopper is capable of being stuck is formed in an outer circumference of the first connecting member, and a gear to which the second stopper is capable of being be stuck is formed in an outer circumference of the second connecting member.

18. The electronic device of claim 16, wherein a first step having a D cut-shaped cross section is formed at, at least, one of two opposite ends of the first magnet group, and a second step having a D cut-shaped cross section is formed at, at least, one of two opposite ends of the second magnet group, and wherein the first connecting member is coupled with the first step, and the second connecting member is coupled with the second step.

19. An electronic device, comprising:
a first housing including a first side surface;
a second housing including a second side surface that is capable of facing at least a portion of the first side surface;
a first magnet group disposed adjacent to the first side surface in the first housing;
a second magnet group disposed adjacent to the second side surface in the second housing;
a first connecting member disposed in the first housing and connected with at least one end of the first magnet group to fix the first magnet group to the first housing;
a second connecting member disposed in the second housing and connected with at least one end of the second magnet group to fix the second magnet group to the second housing;
a first supporting member coupled to at least one first recess formed in an outer circumference of at least a portion between two opposite ends of the first magnet group to support a side of the first magnet group; and a second supporting member coupled to at least one second recess formed in an outer circumference of at least a portion between two opposite ends of the second magnet group to support a side of the second magnet group.

20. The electronic device of claim 19, wherein when the first magnet group includes a plurality of sub magnet groups, the first recess is formed in a boundary between the plurality of sub magnet groups, and when the second magnet group includes a plurality of sub magnet groups, the second recess is formed in a boundary between the plurality of sub magnet groups.

* * * * *